US00RE41867E

(19) United States
(12) Reissued Patent
Yamaguchi

(10) Patent Number: US RE41,867 E
(45) Date of Reissued Patent: Oct. 26, 2010

(54) MOS IMAGE PICK-UP DEVICE AND CAMERA INCORPORATING THE SAME

(75) Inventor: Takumi Yamaguchi, Kyoto (JP)
(73) Assignee: Panasonic Corporation, Osaka (JP)

(21) Appl. No.: 12/397,560
(22) Filed: Mar. 4, 2009

Related U.S. Patent Documents

Reissue of:
(64) Patent No.: 7,205,593
Issued: Apr. 17, 2007
Appl. No.: 10/243,981
Filed: Sep. 13, 2002

(51) Int. Cl.
*H01L 31/103* (2006.01)

(52) U.S. Cl. ..... 257/292; 257/E27.133; 257/374; 257/399; 257/446

(58) Field of Classification Search ..... 257/292
See application file for complete search history.

(56) References Cited

U.S. PATENT DOCUMENTS

| | | | | |
|---|---|---|---|---|
| 4,295,055 | A | 10/1981 | Takemoto et al. | |
| 4,841,369 | A | 6/1989 | Nishizawa et al. | |
| 5,761,125 | A | 6/1998 | Himeno | |
| 5,844,290 | A | 12/1998 | Furumiya | |
| 6,177,333 | B1 * | 1/2001 | Rhodes | 438/433 |
| 6,255,680 | B1 | 7/2001 | Nakashiba | |
| 6,407,417 | B1 | 6/2002 | Nagata et al. | |
| 6,448,104 | B1 * | 9/2002 | Watanabe | 438/60 |
| 6,465,862 | B1 * | 10/2002 | Harris | 257/463 |
| 6,472,699 | B1 * | 10/2002 | Sugiyama et al. | 257/292 |
| 6,576,940 | B2 * | 6/2003 | Maeda | 257/292 |

FOREIGN PATENT DOCUMENTS

| | | |
|---|---|---|
| JP | 63-13581 | 1/1988 |
| JP | 63-153971 | 6/1988 |
| JP | 64-44178 | 2/1989 |
| JP | 6-140615 | 5/1994 |
| JP | 8-055488 | 2/1996 |
| JP | 9-097893 | 4/1997 |
| JP | 10-012854 | 1/1998 |
| JP | 11-238881 | 8/1999 |
| JP | 11-274461 | 10/1999 |
| JP | 11-313257 | 11/1999 |
| JP | 11-345957 | 12/1999 |
| JP | 11-346331 | 12/1999 |
| JP | 2001-007309 | 1/2001 |
| JP | 2001-189441 | 7/2001 |
| JP | 2002-110953 | 4/2002 |
| JP | 2002-164528 | 6/2002 |

OTHER PUBLICATIONS

Partial English Translation of: Hiroyuki Tango "Semiconductor Process Technology" published by Baifukan, Nov. 30, 1998, pp. 39–44.
T. Iizuka, "CMOS technology and integration capability", in Design of CMOS Super LSI, First published by Baihuukan on Apr. 25, 1989, (third on Nov. 20, 1991).
Japanese Office Action, Dec. 16, 2004.

* cited by examiner

*Primary Examiner*—Jerome Jackson, Jr.
(74) *Attorney, Agent, or Firm*—Hamre, Schumann, Mueller & Larson, P.C.

(57) ABSTRACT

A MOS image pick-up device including a semiconductor substrate, an imaging region formed on the semiconductor substrate by arraying plural unit pixels, and a peripheral circuit region including a driving circuit for operating the imaging region formed on the semiconductor substrate; the unit pixels include a photodiode, MOS (metal-oxide-semiconductor) transistors and a first device-isolation portion, the peripheral circuit region includes a second device-isolation portion for isolating devices in the driving circuit; wherein each of the first device-isolation portion and the second device-isolation portion is at least one portion selected from an electrically insulating film formed on the substrate in order not to erode the substrate, a electrically insulating film formed on the substrate so as to erode the substrate to a depth ranging from 1 nm to 50 nm, and an impurity diffusion region formed within the substrate. The MOS image pick-up device is incorporated in a camera. Thereby, devices are isolated between MOS transistors, and noise caused by leakage current is decreased.

12 Claims, 6 Drawing Sheets

MOS IMAGE PICK-UP DEVICE AND CAMERA INCORPORATING THE SAME

Matter enclosed in heavy brackets [ ] appears in the original patent but forms no part of this reissue specification; matter printed in italics indicates the additions made by reissue.

FIELD OF THE INVENTION

The present invention relates to a MOS image pick-up device that is used for a digital camera or the like, and a camera incorporating the same.

BACKGROUND OF THE INVENTION

A MOS image pick-up device denotes an image sensor that amplifies and reads signals of respective pixels by using amplifying circuits including MOS transistors formed on the respective pixels. Recently, such MOS image pick-up devices, particularly, so-called CMOS (complementary MOS) image sensors manufactured in a CMOS process, have been marked as image-inputting devices in portable apparatuses such as miniature cameras for PCs, due to the merits, e.g., they require low voltages and consume less power, and the sensors can be integrated with peripheral circuits so as to form a one-chip device.

In a conventional MOS image pick-up device, every circuit in the peripheral circuit region is designed using a CMOS technique to apply both n-channel MOS transistors and p-channel MOS transistors. In the imaging region, all of the MOS transistors composing each pixel are n-channel MOS transistors. In general, the n-channel MOS transistors composing the pixel are identified with n-channel MOS transistors used in the peripheral circuit region.

FIG. 4 is a cross-sectional view showing a structure of a CMOS transistor used for a peripheral circuit region of a conventional MOS image pick-up device. In a semiconductor substrate 21, an n-type well 26 and a p-type well 25 are formed. A p-channel MOS transistor 22 is formed in the n-type well 26, and an n-channel MOS transistor 23 is formed in the p-type well 25. These transistors are isolated electrically from each other by device-isolation portions 24. The device-isolation portions 24 are oxide films 27 formed by LOCOS (local oxidation of silicon). For further miniaturization, oxide films 28 formed by STI (shallow trench isolation) are used for the electron-isolating portions as shown in FIG. 5.

Since the MOS image pick-up device includes an amplifying circuit in each pixel as described above, it can amplify weak signals so as to realize high sensitivity. On the other hand, when a large amount of current leaks into the photodiode, the leakage current may be amplified and cause a considerable noise.

In the above-described conventional MOS image pick-up device, n-channel MOS transistors composing the pixel are regarded as identical in the structure to the n-channel MOS transistors used in the peripheral circuit region, i.e.. n-channel MOS transistors of a CMOS transistor. Moreover, the device-isolation portions among the transistors are considered to have a common structure in the imaging region and the peripheral region.

However, the CMOS transistors used for the peripheral circuit region are developed in a trend for miniaturizing semiconductor LSI. Therefore, the main object in development of the CMOS transistors is a high-speed process, while substantially no attention is paid for leakage current. For example, in a CMOS transistor shown in FIG. 4, the oxide films 27 used for the device-isolation portions are formed by thermally oxidizing the substrate 21, and thus they erode the substrate 21 by approximately half of the film thickness. In the CMOS transistor shown in FIG. 5, the oxide films 28 used for the device-isolation portions fill trenches formed on the substrate 21, so that the films erode the substrate 21 by their entire thickness. Since the substrate will be subjected to a great stress at parts eroded by the oxide films in the device-isolation portions, a large leakage current will occur. When the device-isolating structure of the CMOS transistor is used for an imaging region, noise due to the leakage current will be increased considerably.

SUMMARY OF THE INVENTION

For solving the above-described problems in the conventional techniques, the present invention provides a MOS image pick-up device that decreases noise caused by leakage current, and also a camera using the MOS image pick-up device.

For achieving the above-described object, a MOS image pick-up device according to the present invention has a semiconductor substrate, an imaging region formed on the semiconductor substrate by arraying plural unit pixels, and a peripheral circuit region including a driving circuit for operating the imaging region formed on the semiconductor substrate, wherein each unit pixel has a photodiode, MOS (metal-oxide-semiconductor) transistors and a first device-isolation portion, and the peripheral circuit region includes a second device-isolation portion for isolating devices in the driving circuit. The MOS image pick-up device is characterized in that each of the first device-isolation portion and the second device-isolation portion is at least one selected from: A) an electrically isolating film formed on the substrate in order not to erode the substrate; B) an electrically insulating film formed on the substrate so as to have a depth eroding the substrate in a range of 1 nm to 50 nm; and C) an impurity diffusion region formed within the substrate.

Next, a camera according to the present invention incorporates a MOS image pick-up device that has a semiconductor substrate, an imaging region formed on the semiconductor substrate by arraying plural unit pixels, and a peripheral circuit region including a driving circuit for operating the imaging region formed on the semiconductor substrate, wherein each unit pixel has a photodiode, MOS (metal-oxide semiconductor) transistors and a first device-isolation portion, and the peripheral circuit region includes a second device-isolation portion for isolating devices in the driving circuit. The camera is characterized in that each of the first device-isolation portion and the second device-isolation portion is at least one selected from: A) an electrically isolating film formed on the substrate in order not to erode the substrate; B) an electrically insulating film formed on the substrate so as to have a depth eroding the substrate in a range of 1 nm to 50 nm; and C) an impurity diffusion region formed within the substrate.

In the present invention, the 'first device-isolation portion' is formed to electrically isolate devices existing in a pixel.

DETAILED DESCRIPTION OF THE INVENTION

In the present invention, each of the first device-isolation portion and the second device-isolation portion is at least one of: A) an electrically isolating film formed on the substrate in order not to erode the substrate; B) an electrically insulating film formed on the substrate so as to have a depth eroding the substrate in a range of 1 nm to 50 nm; and C) an impurity diffusion region formed within the substrate. Therefore, stress applied to the substrate is decreased and the leakage current can be inhibited. As a result, noise caused by the leakage current can be decreased. When the device-isolation portion is a film of B), stress applied to the device-isolation portion can be decreased and the leakage current can be inhibited since the erosion depth into the substrate is shallow, i.e., it is controlled within a range of 1 nm to 50 nm.

It is preferable in the MOS image pick-up device that the impurity diffusion region is formed by ion implantation.

It is preferable in the MOS image pick-up device that the insulating film has a thickness ranging from 1 nm to 500 nm.

It is preferable in the MOS image pick-up device that in the imaging region the first device-isolation portion formed adjacent to the photodiode is composed of an impurity diffusion region formed in the substrate.

It is preferable in the MOS image pick-up device that at least one part of the driving circuit is a dynamic circuit, thereby decreasing the energy consumption.

It is preferable in the MOS image pick-up device that a dark current inhibiting layer is formed in the surface layer of the photodiode, thereby inhibiting leakage current occurring due to defects in the vicinity of the substrate surface on the photodiode.

As described above, according to a MOS image pick-up device of the present invention where device-isolation portions among MOS transistors have a particular structure, noise caused by leakage current can be decreased.

The details will be described below with reference to the attached drawings.

Figure 2:
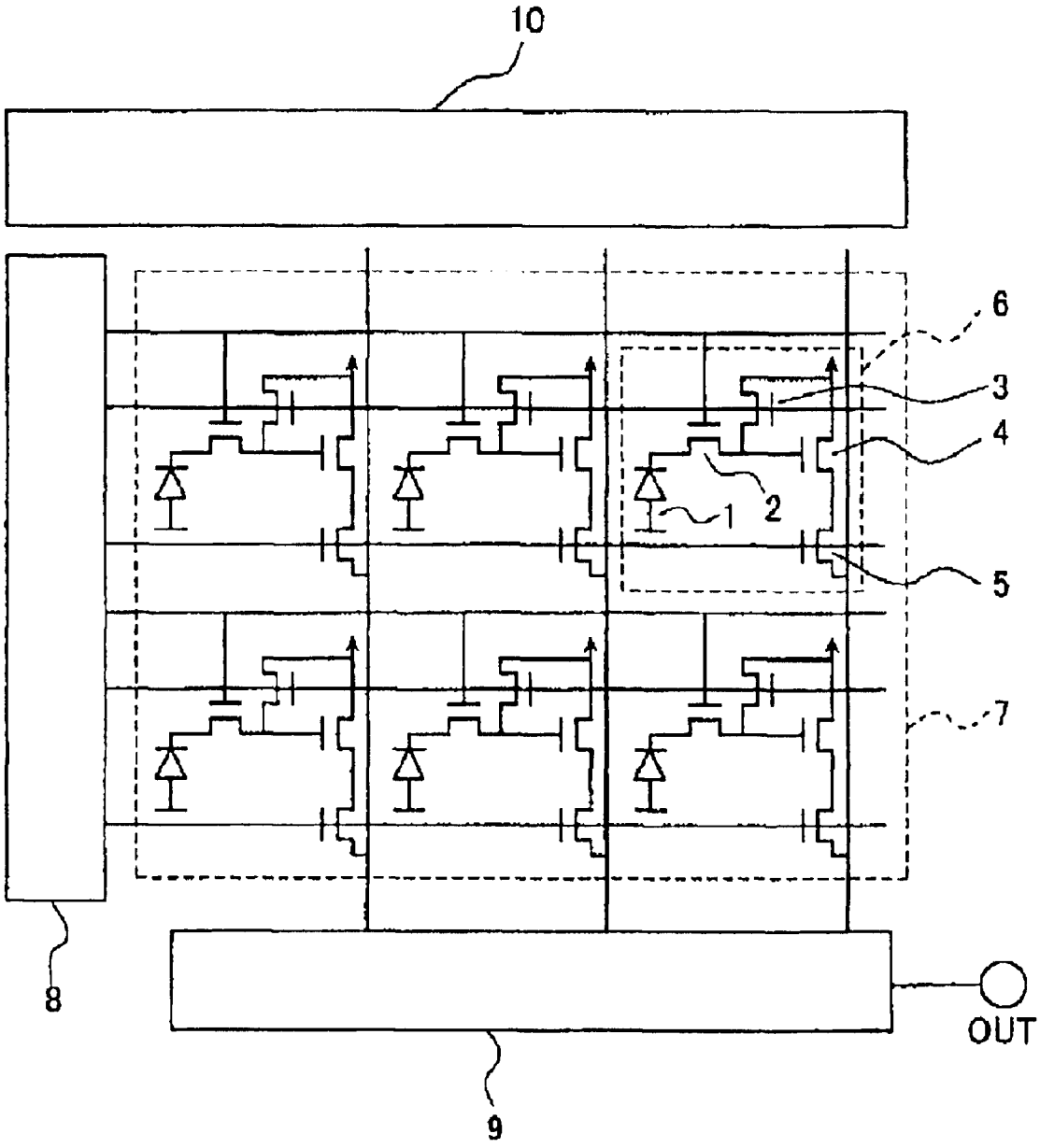
FIG. 2 is a schematic view showing a configuration of a MOS image pick-up device according to the present invention.

FIG. 2 shows an example of a MOS image pick-up device of the present invention. This solid-state imaging device has an imaging region 7 with plural pixels 6 arranged one-dimensionally or two-dimensionally, and a peripheral circuit region arranged around the imaging region.

This MOS image pick-up device includes, on a semiconductor substrate, an imaging region 7 in which plural pixels 6 are arrayed two-dimensionally, a vertical shift resistor 8 and a horizontal shift resistor 9 for selecting pixels, and a timing-generation circuit 10 for feeding pulses necessary for the shift resistors (hereinafter, a region other than the imaging region 7 is expressed as 'a peripheral circuit region', which includes the vertical shift resistor 8, the horizontal shift resistor 9, and the timing-generation circuit 10). In the imaging region 7, each of the pixels 6 is composed of a photodiode 1 and four MOS transistors, i.e., a charge-transferring transistor 2, a resetting transistor 3, an amplifying transistor 4 and a selecting transistor 5. In the peripheral circuit region, the vertical shift resistor 8, the horizontal shift resistor 9 and the timing-generation circuit 10 are composed by using plural MOS transistors.

Each of the pixels 6 composing the imaging region 7 includes the photodiode 1 and the four MOS transistors, i.e., the charge-transferring transistor 2, the resetting transistor 3, the amplifying transistor 4 and the selecting transistor 5. The charge-transferring transistor 2 uses the photodiode 1 as a source, and its drain is electrically connected with a gate of the amplifying transistor 4. The amplifying transistor 4 has a drain that is electrically connected with a power supply voltage and a source that is electrically connected with a drain of the selecting transistor 5. The resetting transistor 3 has a source that is electrically connected with a drain of the charge-transferring transistor 2 and also a source that is electrically connected with a power supply voltage. The selecting transistor 5 has a source connected to an output line.

The following is a brief explanation about functions of the respective transistors. The charge-transferring transistor 2 transfers signal charge generated due to a photoelectric exchange at the photodiode 1 into a detecting portion (the drain of the charge-transferring transistor 2). The detecting portion stores signal charge and inputs a voltage corresponding to the electric charge into the amplifying transistor 4. The amplifying transistor 4 amplifies the voltage of the detecting portion, and the selecting transistor 5 as a switch for taking out output of the amplifying transistor 4 selects a pixel for reading the signal. The resetting transistor 3 discharges the signal electric charge stored in the detecting portion at a predetermined time interval.

Figure 1A:
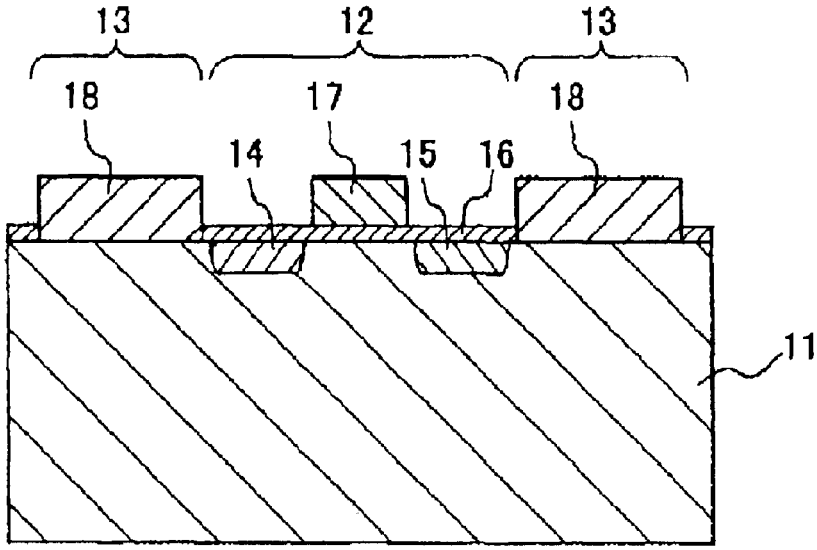
FIG. 1A is a cross-sectional view showing an example of device-isolation portions according to a first embodiment of the present invention.
Figure 1B:
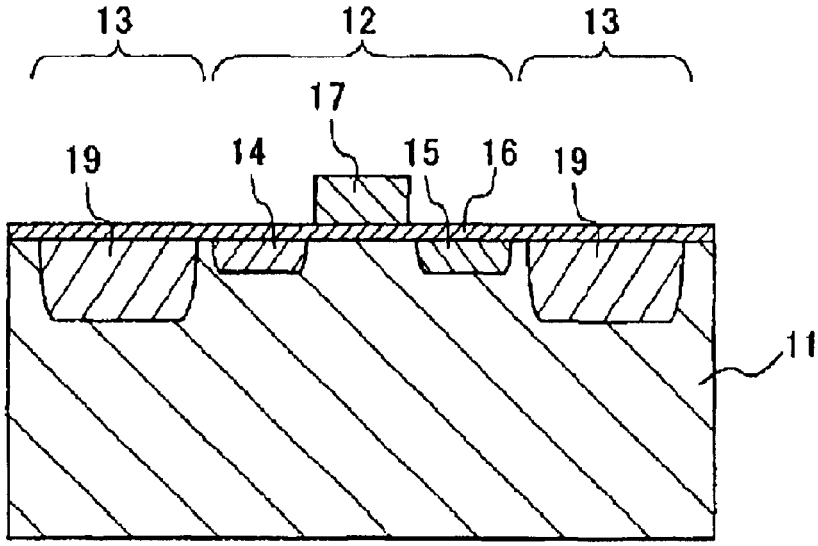
FIG. 1B is a cross-sectional view showing an example of device-isolation portions according to a second embodiment.

FIG. 1A and FIG. 1B are cross-sectional views showing examples of MOS transistors and the peripheral structures. In each MOS transistor 12, a source 14 and a drain 15 as n-type diffusion regions are formed within a p-type semiconductor substrate 11 (or a p-type well). Agate electrode 17 is formed on a part of the semiconductor substrate 11 through an insulating film 16, and the gate electrode 17 is located between the source 14 and the drain 15.

As shown in FIGS. 1A and 1B, respective MOS transistors 12 are electrically isolated from each other by device-isolation portions 13. Each device-isolation portion 13 can be configured by forming an isolation oxide film 18 on the semiconductor substrate 11 as shown in FIG. 1A. Alternatively, the device-isolation portion 13 can be configured by forming an isolation-diffusion region 19 within the semiconductor substrate 11 as shown in FIG. 1B. Alternatively, both the isolation oxide film 18 and the isolation-diffusion region 19 can be formed together. Structures of the device-isolation portions will be detailed later.

The photodiode 1 is an n-type diffusion region formed within the p-type semiconductor substrate (or a p-type well). As described above, the photodiode composes a source of a charge-transferring transistor, and similar to the sources for other MOS transistors, a device-isolation portion is formed in a region adjacent to a photodiode.

It is further preferable that a p-type diffusion region is formed as a dark current inhibiting layer on the surface layer part of the n-type diffusion region as a photodiode. In this case, it is preferable that the dark current inhibiting layer extends to the device-isolation portion formed adjacent to the photodiode. That is, when the device-isolation portion is composed of an isolation oxide film, preferably, it extends below the isolation oxide film. When the device-isolation portion is composed of an isolation-diffusion region, the dark current inhibiting layer preferably extends into the isolation-diffusion region.

Although an n-channel MOS transistor is shown as an example of MOS transistors composing the respective pixels, it is also possible to use a p-channel MOS transistor. In this case, the MOS transistor has a structure where a source as a p-type diffusion region and a drain are formed in an n-type semiconductor substrate (or n-type well). The photodiode is composed of a p-type diffusion region, and the dark current inhibiting layer is composed of an n-type diffusion region.

As shown in FIG. 2, a peripheral circuit region includes a horizontal shift resistor 8 and a vertical shift resistor 9 for pixel selection, and a driving circuit such as a timing-generation circuit 10 for feeding pulses necessary for operation of the shift resistors.

Figure 3:
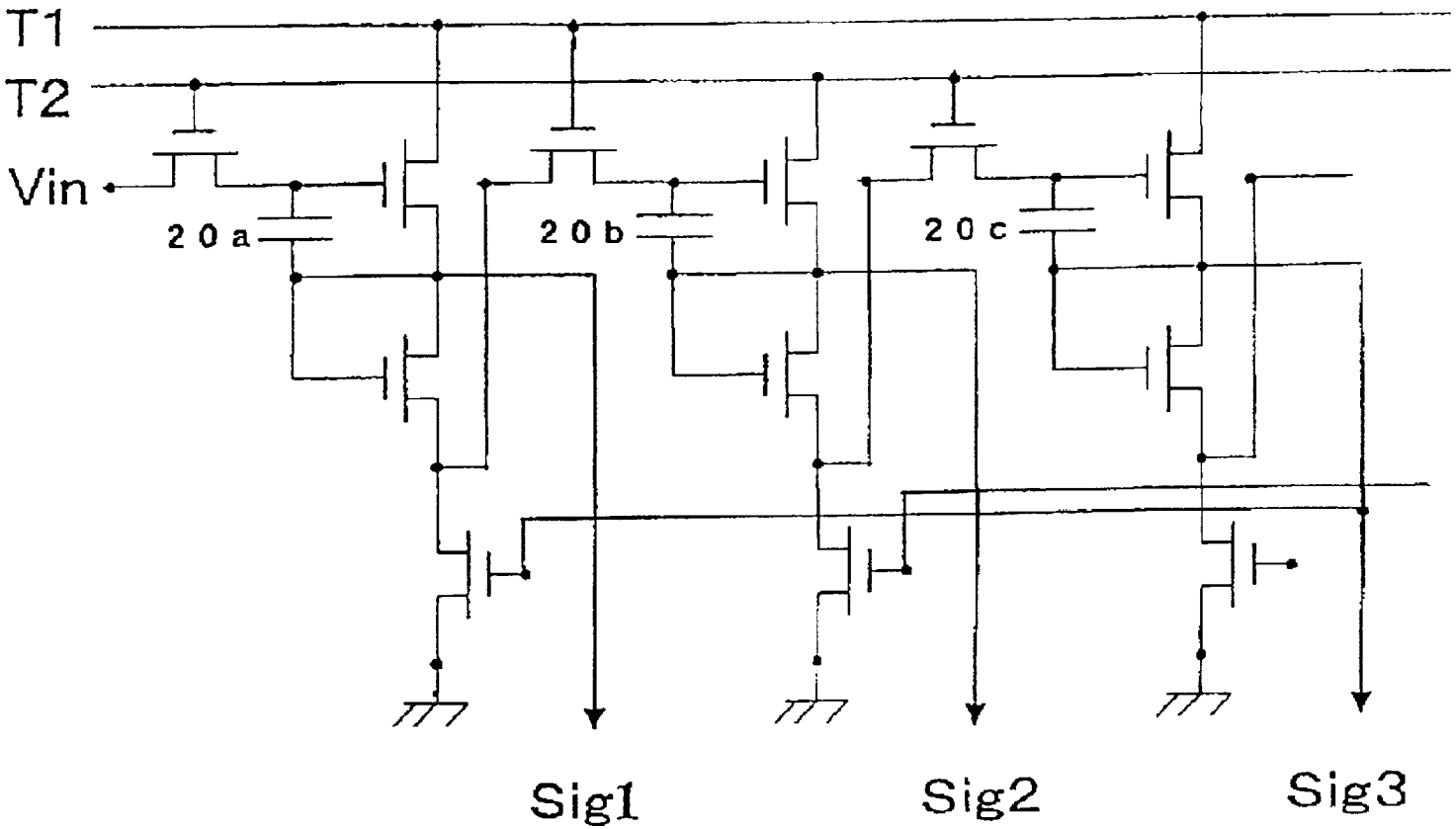
FIG. 3 is a circuit diagram showing an example of a dynamic circuit that can be used for a driving circuit of a MOS image pick-up device of the present invention.
Figure 4:
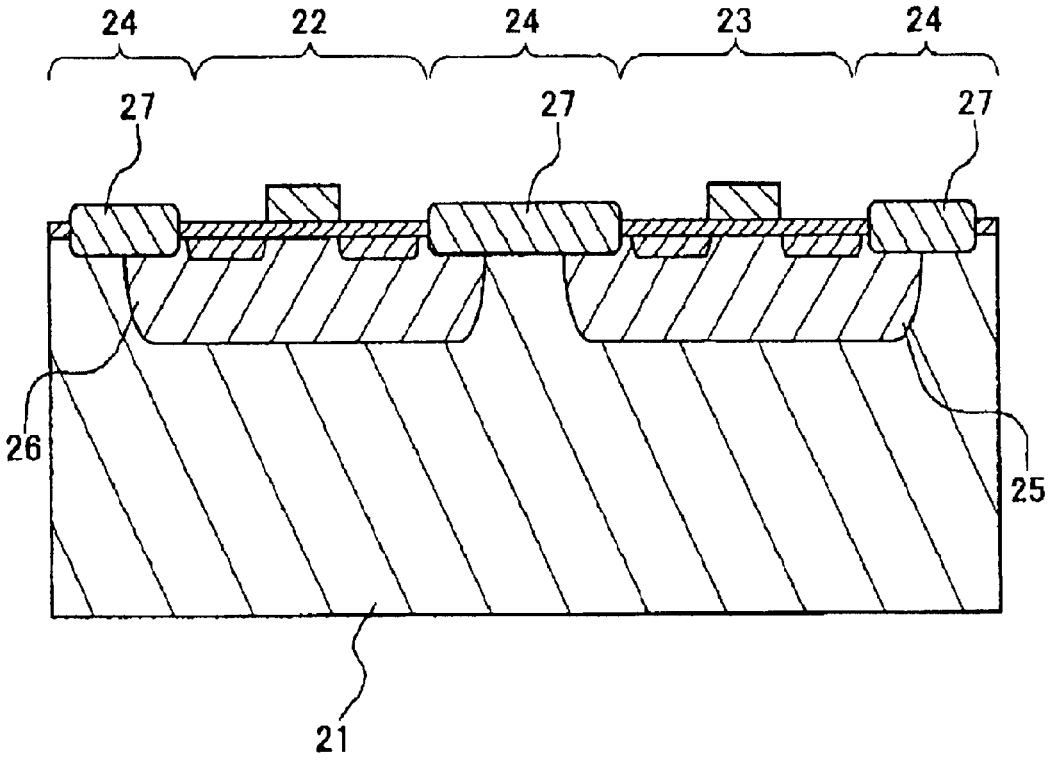
FIG.4 PRIOR ART
FIG. 4 is a cross-sectional view showing a structure of a CMOS transistor and its device-isolation portions for composing a conventional MOS image pick-up device.
Figure 5:
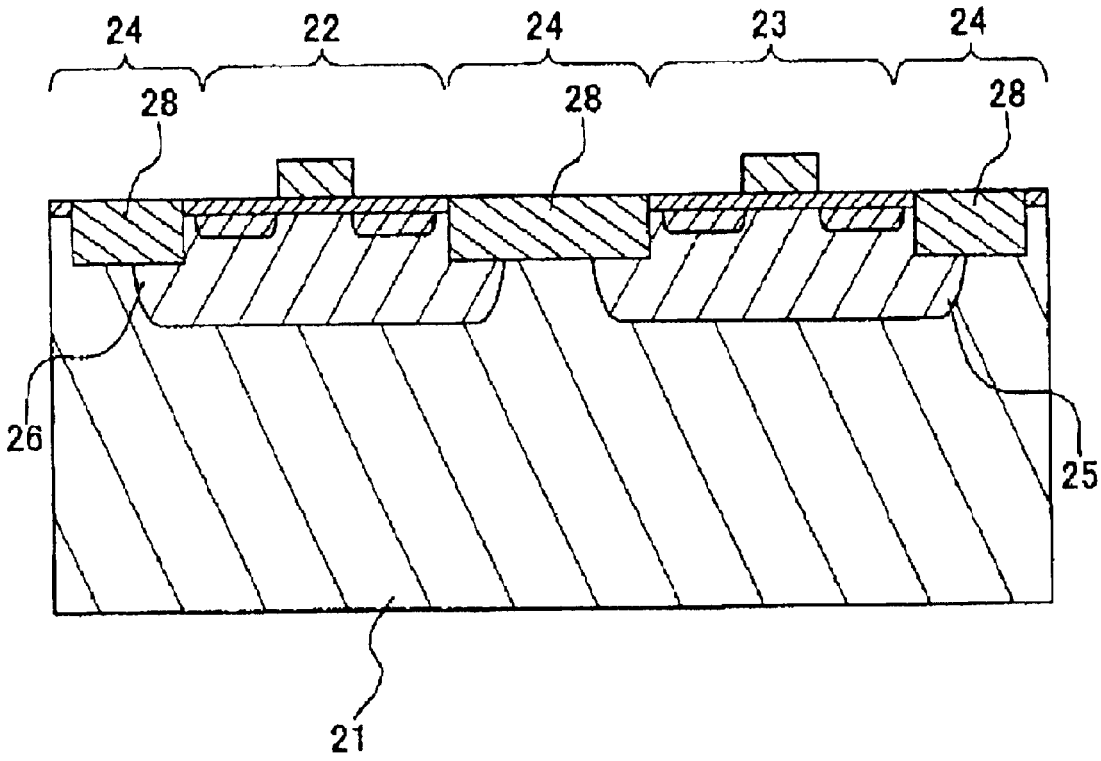
FIG.5 PRIOR ART
FIG. 5 is a cross-sectional view showing a structure of a CMOS transistor and its device-isolation portions for composing a conventional MOS image pick-up device.

In the peripheral circuit, it is preferable that the driving circuit is composed of a dynamic circuit for decreasing power consumption. FIG. 3 is a circuit diagram showing an example of a dynamic circuit available for the horizontal shift resistor and the vertical shift resistor.

Since a typical dynamic circuit retains data dynamically in capacitors (20a, 20b and 20c in FIG. 3), a great leakage current can destroy data. However, this embodiment can solve this problem since a structure for decreasing the leakage current is used for the device-isolation portions that isolate MOS transistors of the driving circuit.

A driving circuit contains plural MOS transistors, and the MOS transistors are electrically isolated from each other by device-isolation portions. The device-isolation portions can be configured similar to the device-isolation portions in an imaging region. That is, each device-isolation portion can be configured by forming an isolation oxide film on the semiconductor substrate; forming an isolation-diffusion region within the semiconductor substrate; or forming both the isolation oxide film and the isolation-diffusion region together. The structures of the device-isolation portions will be detailed later.

It is further preferable that all the MOS transistors composing pixels of the imaging region and the MOS transistors composing the driving circuit in the peripheral circuit region have the same structure, so that the manufacturing process can be simplified.

The following description is about device-isolation portions among MOS transistors in the imaging region and the peripheral circuit region.

As described above, both the imaging region and the peripheral circuit region have device-isolation portions configured by forming an isolation oxide film on a semiconductor substrate (hereinafter, referred to as 'a first embodiment'), or by forming an isolation-diffusion region within a semiconductor substrate (hereinafter, referred to as 'a second embodiment').

FIG. 1A is a cross-sectional view showing device-isolation portions 13 in the first embodiment. For each of the device-isolation portions 13, an isolation oxide film 18 is formed on a semiconductor substrate 11. The isolation oxide film 18 does not erode the semiconductor substrate 11, and it is, for example, a deposited film formed on the flat surface of the semiconductor substrate. Such an isolation oxide film 18 can be formed, for example, by a CVD method.

Figure 6:
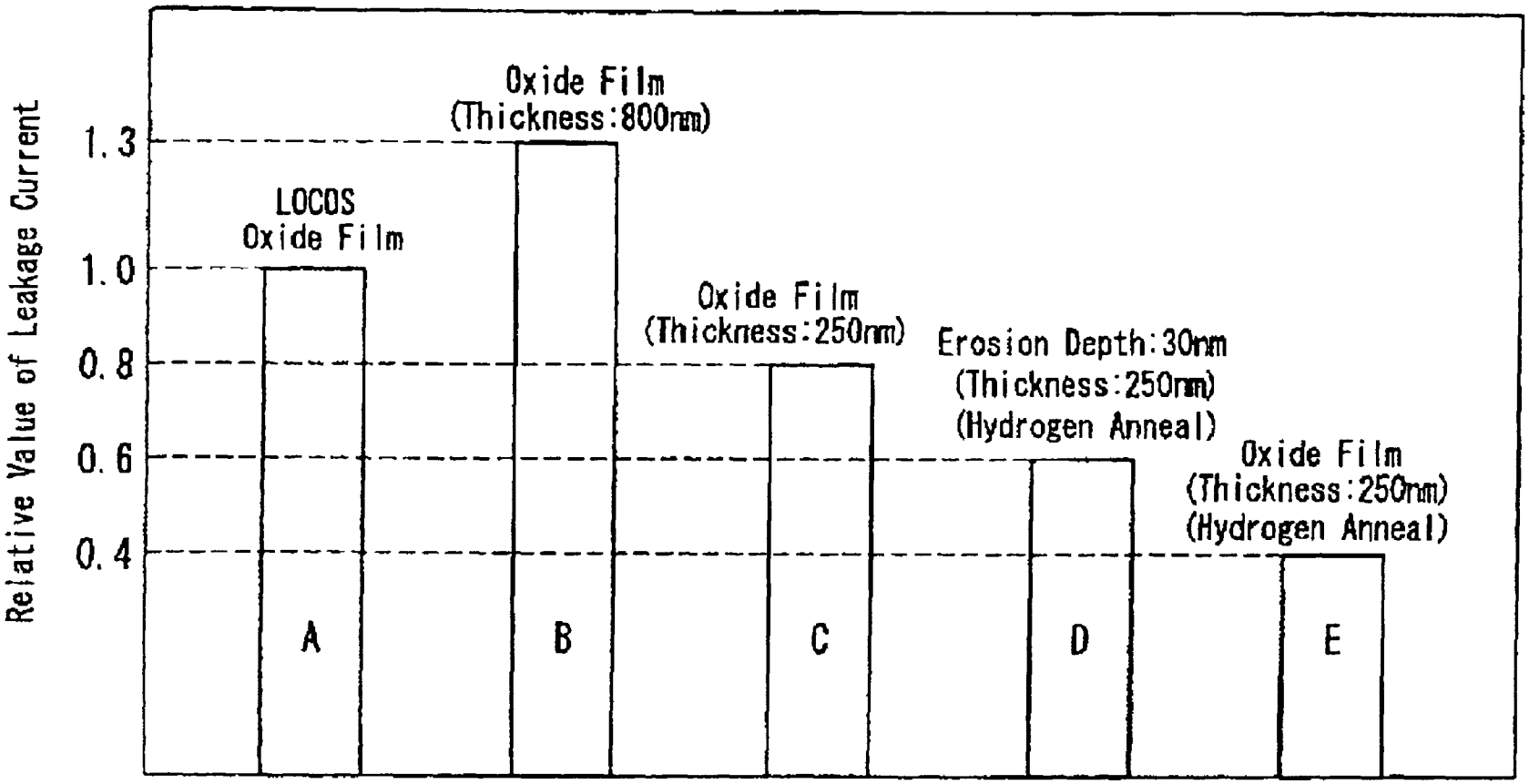
FIG. 6 is a graph for comparing leakage currents that vary depending on isolation oxide films in the first embodiment of the present invention.

FIG. 6 is a graph for comparing leakage currents that vary depending on isolation oxide films.

When the isolation oxide film 18 has a thickness as large as 800 nm ('B' in FIG. 6), stress will be concentrated to end portions of the isolation oxide film 18 at the interface between the isolation oxide film 18 and either the source 14 or the drain 15, due to an influence of heat treatment or the like carried out after formation of the isolation oxide film 18. As a result, the stress becomes greater and the leakage current is increased to 1.3 times in a comparison with a case of an oxide film 27 formed by LOCOS (local oxidation of silicon) illustrated as 'A' in FIG. 6. Preferably, the film thickness is decreased to not more than 500 nm, preferably not more than 400 nm, more preferably not more than 250 nm, so that the leakage current at the end portions of the isolation oxide film 18 can be decreased in comparison with the leakage current of the oxide film 27 formed by LOCOS (local oxidation of silicon). When the thickness of the isolation oxide film 18 is 250 nm ('C' in FIG. 6), the leakage current is as low as 0.8 times.

Since an LSI of a typical CMOS has a GND power source in the unit cells, current can leak from GND to VDD (e.g., 3V), passing beneath the isolation oxide film, and thus, the isolation oxide film should be thickened to be about 300 nm for improving voltage endurance for device-isolation. On the other hand, since an amplification type unit pixel does not always require a GND power source in the pixel, the thickness of the isolation oxide film 18 can be decreased to a range of 4 nm to 250 nm, thereby decreasing the leakage current of the isolation oxide film 18.

Furthermore, by annealing in a hydrogen atmosphere after formation of the isolation oxide film 18, defects caused by stress at the end portions of the isolation oxide film 18 can be corrected. This can further decrease the leakage current to 0.4 times ('E' in FIG. 6).

In the insulating film shown in FIG. 1A, the isolation oxide film 18 is formed on the semiconductor substrate 11 together with an insulating film in order not to erode the substrate. A test result shows that when a depth that the isolation oxide film 18 erodes the semiconductor substrate 11 is 50 nm or less, annealing in a hydrogen atmosphere can decrease leakage current, i.e., the leakage current indicated as D in FIG. 6 is 0.6 times the leakage current in the oxide film 27 formed by LOCOS (local oxidation of silicon).

FIG. 1B is a cross-sectional view of device-isolation portions in a second embodiment. Each device-isolation portion 13 includes an isolation-diffusion region 19 formed within the semiconductor substrate 11. According to the second embodiment, the effect of inhibiting leakage current is further improved in comparison with the first embodiment. The isolation-diffusion regions 19 will be p-type diffusion regions for isolating n-channel MOS transistors, while n-type diffusion regions are used for isolating p-type MOS transistors. The isolation-diffusion regions 19 can be formed by, for example, ion-implanting p-type or n-type impurities into a semiconductor substrate.

The impurity concentration and diffusion depth of the isolation-diffusion regions 19 will not be limited specifically as long as the MOS transistor 12 can be isolated electrically. The impurity concentration is, for example, $10^{14}$ $cm^{-3}$ to $10^{22}$ $cm^{-3}$, preferably $10^{15}$ $cm^{-3}$ to $10^{20}$ $cm^{-3}$, further preferably $10^{17}$ $cm^{-3}$ to $10^{20}$ $cm^{-3}$. The diffusion depth is, for example, more than 0 μm and not more than 7 μm, preferably more than 0 μm and not more than 2 μm, further preferably more than 0 μm and not more than 1 μm.

The device-isolation portion can have a structure for using both an isolation oxide film and an isolation-diffusion region (hereinafter, the structure is referred to as 'a third embodiment'). In the structure, even when leakage current occurs at the interface between the isolation oxide film and the semiconductor substrate, this leakage current can be recontacted in the isolation-diffusion region, thereby enhancing the effect of decreasing the leakage current.

For the imaging region, it is preferable that the second embodiment is applied for the structure of the device-isolation portion adjacent to the photodiode, so that an excellent effect is obtained in inhibiting leakage current. Though the second embodiment can be used for the other device-isolation portion in the imaging region, use of either the first or third embodiment is particularly preferable, since the amplifying circuit in each pixel can be operated at high speed.

In the peripheral circuit region, it is preferable to use either the first or the third embodiment for the structure of the device-isolation portion, since the driving circuit can be operated at high speed.

The device-isolation portion in the imaging region and the device-isolation portion in the peripheral circuit region can be selected separately from the first, second and third embodiments. Preferred examples of the combinations are described below.

In a first combination, the device-isolation portion in the imaging region and that in the peripheral circuit region have the same structure. In this case, though the second embodiment can be used for the device-isolation portion, the first or third embodiment is preferred particularly.

In a second combination, the second embodiment is used for the device-isolation portion in the imaging region while the first or third embodiment is used for the device-isolation portion in the peripheral circuit region. This structure can decrease leakage current leaking into the photodiode and realize a high-speed operation of the driving circuit.

In a third combination, the second embodiment is used for the device-isolation portion adjacent to the photodiode in the imaging region, and either the first or the third embodiment is used for the other device-isolation portions, and the first or the third embodiment is used for the device-isolation portion in the peripheral circuit region.

Accordingly, leakage current leaking into the photodiode can be decreased, and the driving circuit and the amplifying circuit in the pixel can be operated at high speed.

What is claimed is:

1. A MOS (metal-oxide-semiconductor) image pick-up device comprising:

a semiconductor substrate, an imaging region formed on the semiconductor substrate by arraying plural unit pixels, and a peripheral circuit region comprising a driving circuit for operating the imaging region formed on the semiconductor substrate;

where each of the unit pixels comprises: a photodiode, MOS transistors, and a first device-isolation portion comprising a portion next to the photodiode and a portion not next to the photodiode, and the peripheral circuit region comprises a second device-isolation portion for isolating devices in the driving circuit, wherein the following are satisfied:

I. each of the first device-isolation portion not next to the photodiode and the second device-isolation portion has a structure comprising:

A. an electrically insulating film formed on a surface of the substrate so as to erode the substrate to a depth in a range of 1 nm to 50 nm, or B. both an electrically insulating film formed on a surface of the substrate so as to erode the substrate to a depth in a range of 1 nm to 50 nm and an impurity diffusion region formed within the substrate, and II. each of the first device-isolation portions next to the photodiode has a structure consisting of only an impurity diffusion region formed within the substrate directly under the substrate surface.

2. The MOS image pick-up device according to claim 1, wherein the impurity diffusion region is formed by ion implantation.

3. The MOS image pick-up device according to claim 1, wherein at least one part of the driving circuit is a dynamic circuit.

4. The MOS image pick-up device according to claim 1, wherein the photodiode has a surface portion having a dark current inhibiting layer.

5. The MOS image pick-up device according to claim 1, wherein the first device-isolation portion and the second device-isolation portion are formed by annealing in a hydrogen atmosphere.

6. A camera comprising a MOS (metal-oxide-semiconductor) image pick-up device comprising:

a semiconductor substrate, an imaging region formed on the semiconductor substrate by arraying plural unit pixels, and a peripheral circuit region comprising a driving circuit for operating the imaging region formed on the semiconductor substrate;

where each of the unit pixels comprises: a photodiode, MOS transistors, and a first device-isolation portion comprising a portion next to the photodiode and a portion not next to the photodiode, and the peripheral circuit region comprises a second device-isolation portion for isolating devices in the driving circuit, wherein the following are satisfied:

I. each of the first device-isolation portion not next to the photodiode and the second device-isolation portion has a structure comprising:

A. an electrically insulating film formed on a surface of the substrate so as to erode the substrate to a depth in a range of 1 nm to 50 nm, or B. both an electrically insulating film formed on a surface of the substrate so as to erode the substrate to a depth in a range of 1 nm to 50 nm and an impurity diffusion region formed within the substrate, and II. each of the first device-isolation portions next to the photodiode has a structure consisting of only an impurity diffusion region formed within the substrate directly under the substrate surface.

7. The camera according to claim 6, wherein the impurity diffusion region is formed by ion implantation.

8. The camera according to claim 6, wherein at least one part of the driving circuit is a dynamic circuit.

9. The camera according to claim 6, wherein the photodiode has a surface portion having a dark current inhibiting layer.

10. The camera according to claim 6, wherein the first device-isolation portion and the second device-isolation portion are formed by annealing in a hydrogen atmosphere.

11. A MOS (metal-oxide-semiconductor) image pick-up device comprising:

a semiconductor substrate, an imaging region formed on the semiconductor substrate by arraying plural unit pixels, and a peripheral circuit region comprising a driving circuit for operating the imaging region formed on the semiconductor substrate;

where each of the unit pixels comprises: a photodiode, MOS transistors, and a first device-isolation potion, and the peripheral circuit region comprises a second device-isolation portion for isolating devices in the driving circuit, wherein the following are satisfied:

I. the first device-isolation portion has a structure comprising:

A. an electrically insulating film formed on a surface of the substrate so as to erode the substrate to a depth in a range of 1 nm to 50 nm, or B. an impurity diffusion region formed within the substrate directly under the substrate surface, and II. the first device-isolation portion and the second device-isolation portion have respective structures selected separately so as to be different from each other.

[12. A MOS (metal-oxide-semiconductor) image pick-up device comprising:

a semiconductor substrate, an imaging region formed on the semiconductor substrate by arraying plural unit pixels, and a peripheral circuit region comprising a driving circuit for operating the imaging region formed on the semiconductor substrate;

where each of the unit pixels comprises: a photodiode, MOS transistors, and a first device-isolation portion, and the peripheral circuit region comprises a second device-isolation portion or isolating devices in the driving circuit, wherein the following is satisfied:

the first device-isolation portion and the second device-isolating portion are selected separately from respective structures comprising:

A. an electrically insulating film formed on a surface of the substrate so as to erode the substrate to a depth in a range of 1 nm to 50 nm, or B. an impurity diffusion region formed within the substrate directly under the substrate surface.]

*13. A camera comprising a MOS (metal-oxide-semiconductor) image pick-up device comprising:*

*a semiconductor substrate:*

*an imaging region formed on the semiconductor substrate by arraying plural unit pixels, and*

*a peripheral circuit region comprising a driving circuit for operating the imaging region formed on the semiconductor substrate;*

*where each of the unit pixels comprises: a photodiode, MOS transistors, and a first device-isolation portion, and*

*the peripheral circuit region comprises a second device-isolation portion for isolating devices in the driving circuit,*

*wherein the following is satisfied:*

*I. the first device-isolation portion has a structure comprising:*

*A. an electrically insulating film formed on a surface of the substrate so as to erode the substrate to a depth in a range of 1 nm to 50 nm, or*

*B. an impurity diffusion region formed within the substrate directly under the substrate surface, and*

*II. the first device-isolation portion and the second device-isolation portion have respective structures selected separately so as to be different from each other.*

* * * * *